United States Patent
Koenigsmann et al.

(10) Patent No.: US 8,659,328 B2
(45) Date of Patent: Feb. 25, 2014

(54) METHOD FOR TRANSMITTING A BINARY SIGNAL VIA A TRANSFORMER

(75) Inventors: Gunther Koenigsmann, Erlangen-Tennenlohe (DE); Alexander Muehlhoefer, Oberasbach (DE); Markus Hofmair, Roth (DE); Daniel Obernoeder, Iphofen (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 13/104,616

(22) Filed: May 10, 2011

(65) Prior Publication Data

US 2013/0049815 A1 Feb. 28, 2013

(30) Foreign Application Priority Data

May 10, 2010 (DE) .......................... 10 2010 028 817

(51) Int. Cl.
*H03B 1/00* (2006.01)
*H03K 3/00* (2006.01)

(52) U.S. Cl.
USPC .......................................... 327/109; 327/108

(58) Field of Classification Search
USPC .................................................. 327/108, 109
See application file for complete search history.

(56) References Cited

U.S. PATENT DOCUMENTS

2002/0175719 A1* 11/2002 Cohen ........................... 327/108

FOREIGN PATENT DOCUMENTS

EP 0486359 5/1992

* cited by examiner

*Primary Examiner* — John Poos
(74) *Attorney, Agent, or Firm* — The Law Offices of Roger S. Thompson

(57) ABSTRACT

A method for the repetitive transmission of a signal representing a binary value via a transformer section of a driver of a power semiconductor. Transmitting for the first value a first pulse packet as a sequence of a positive pulse and a negative pulse or for the second value a second pulse packet as a sequence of a negative pulse and a positive pulse to the input of the transformer. The respective pulse packets are repetitively fed to the transformer, one of the first value and the second value is detected at the output of the transformer from the sequence of the polarity of an output variable within a transmitted pulse packet.

4 Claims, 5 Drawing Sheets

METHOD FOR TRANSMITTING A BINARY SIGNAL VIA A TRANSFORMER

BACKGROUND OF THE INVENTION

1. Field of the Invention

The invention relates to a method for the repetitive transmission of a signal representing a binary value via a transformer section of a driver of a power semiconductor.

2. Description of the Related Art

The driving of a power semiconductor, e.g., of a power semiconductor switch in the form of an IGBT (insulated-gate bipolar transistor), necessitates a so-called driver circuit, or a driver for short. By way of example, the driver generates a signal from a logical switching signal of weak power that is fed to the driver at the input. The signal is applied to the power semiconductor at the output of the driver and has significantly increased power, which is necessary, for example, for actually switching an IGBT. Moreover, the driver performs electrical or potential isolation between its input and output, e.g., the switching signal or a drive logic operating at earth potential (ground) and the power semiconductor, which operates at high-voltage potential.

In general, within this driver, therefore, a binary signal, i.e., a signal representing a binary value, is transmitted via a transformer section of the driver. The transformer effects the potential isolation in the signal to be transmitted. A corresponding binary signal is, e.g., a switch-on or switch-off signal for the transformer. A signal in the form of a switching signal has, e.g., only the two signal values "on" and "off". In order to obtain a high switching reliability, it is customary to transmit corresponding signals or signal values repetitively. It is known, for example, when a switch-on signal is applied, to feed to the transformer as a first binary value—e.g., proceeding from a center potentia—repetitively positive voltage pulses. These pulses are fed to the transformer until a switch-off of the power semiconductor is desired. Proceeding from the center potential, repetitively negative voltage pulses are thereupon fed to the transformer.

During the presence both of the switch-on signal and of the switch-off signal, the transformer or the magnetization thereof attains positive or negative saturation as a result of repetitive application of the respective identical positive or negative voltage pulses. In order to avoid saturation of the transformer, it is known to utilize the time between two identical successive repetitively applied pulses as a recovery time for the transformer so that the latter can at least partly be demagnetized again. Therefore, it is necessary to have a minimum time or minimum dead time between two identical repetitive pulses.

SUMMARY OF THE INVENTION

It is an object of the invention to specify an improved method for the repetitive transmission of a signal representing a binary value via a transformer section of a driver of a power semiconductor.

According to the invention, a first pulse packet as a sequence of a positive pulse and a negative pulse—proceeding from a center signal position—is fed to the input of the transformer for the first of the binary values of the signal. Alternatively, a second pulse packet as a sequence of a negative pulse and positive pulse is fed to the transformer for the second value of the binary signal. In this case, a pulse can be, e.g., a current pulse or a voltage pulse. Therefore, e.g., starting from a center voltage, a sequence of a positive and a negative voltage pulse or voltage, or a negative-positive sequence, is fed to the transformer. By way of example, proceeding from a zero current, a short positive current pulse, followed by a negative current pulse, or vice versa, can also be fed.

The respective identical packets are repetitively fed to the transformer. The polarity of an output variable is then monitored or evaluated at the output of the transformer: in this case, the output variable can again be, e.g., an output voltage or an output current of the transformer. However, the evaluation is then effected not solely from one of the two pulses, but rather from the totality thereof or the entire signal profile within the pulse sequence. Therefore, the first or second value of the binary signal is detected only from the sequence of the polarity or the change in polarity of the output variable within a transmitted packet. The only condition for this is that the packet boundaries at the output of the transformer have to be discernable, e.g., by complying with specific set timing limits.

Since each pulse packet respectively contains both a positive pulse and a negative pulse, it is possible to prevent the transformer from becoming saturated. For this purpose, by way of example, the positive and negative pulses are adapted to one another with regard to the energy that they comprise, e.g., in such a way that the magnetization effect thereof in the transformer at least approximately compensates for one another. Since the transformer does not become saturated as a result of the respective pulse packet, it is not necessary, in particular, to comply with the abovementioned constrained pauses or dead times between two repetitive pulse packets of the same binary value. The pulse packets can therefore succeed one another—whilst complying with the abovementioned conditions for discerning the packet boundaries—virtually as rapidly as desired, in particular with any desired time interval.

In this case, the transformer section in a driver can be situated both from the primary side to the secondary side and in the opposite direction. The only prerequisite for the method according to the invention is that the signal receiver, i.e., the evaluation circuit connected to the transformer on the output side, can evaluate both positive and negative output signals of the transformer.

The first signal can be, e.g., a switching signal to be transmitted from the primary side to the secondary side, or a fault signal to be transmitted in the opposite direction.

In one preferred embodiment, the respective amplitudes of the two pulses within the pulse packet are at least approximately equal in magnitude. In other words, a pulse packet consists of, e.g., two pulses of equal magnitude and opposite sign. If their duration is then also identical, the energy content of the pulses is also identical.

In one advantageous embodiment of the inventive method, the binary signal is a first signal and at the input of the transformer the time interval between two successive pulse packets of the same value as the first signal is varied in a manner dependent on a second signal to be transmitted. At the output, the time interval is then determined from the detected pulse packets mapped in the output variable, and the second signal is reconstructed from the time interval determined on the output side.

Since, as mentioned, according to the invention it is not necessary to comply with minimum dead times between successive pulse packets and the time intervals can be varied in a wide range, a second signal can therefore be superposed on the actual first binary signal to be transmitted. In this case, the second signal, too, can be e.g., a binary signal having only two values and thus two time intervals between successive pulse packets. Here, however, depending on the evaluation logic on the output side, a plurality of values or a continuous signal are/is conceivable as a second signal, that is to say that there exists a plurality of different or continuously varying time intervals between pulse packets.

It is merely necessary to take account of the fact that a change in value of the first signal can generally be effected at any desired point in time, such that the time interval between a last pulse packet of one binary value of the first signal and the first pulse packet of the succeeding binary value must not be identified as a valid second signal. In other words, a change in value in the first signal at this point generally destroys the value of the second signal.

The second signal can be, e.g., the value of an intermediate circuit voltage or a soft-off switching signal.

In a further embodiment of the method, alternatively or additionally, at the input, the duration of the pulse is varied in a manner dependent on a third signal to be transmitted. At the output, the duration of the pulse is then determined, and the third signal is reconstructed from the pulse duration. Consequently, in one and the same signal still further additional information can be transmitted in the form of the third signal, which, in the same way as the second signal, can be binary, multi-valued or continuous. Depending on the conditions for signal generation at a transformer input, it can also be ensured that the change in the first binary signal is permitted or is transmitted only outside the duration of pulse packets. First and third signals would therefore not mutually disturb one another, for example. In general, however, the priority of the first signal will be desirable if said signal is, e.g., a switching signal for a power semiconductor switch, but the second and third signals represent, e.g., less critical data to be transmitted.

The third signal can represent, e.g., the value of a measured temperature.

All three possibilities mentioned above for signal transmission in respect of the first to third signals can thus be used independently of one another or together in corresponding combinations, both from the primary side to the secondary side and vice versa. The transmission of the signals is always effected in parallel in the same direction.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments in the drawings, in which, in each case in a schematic basic diagram.

DETAILED DESCRIPTION OF THE PRESENTLY PREFERRED EMBODIMENTS

Figure 1:
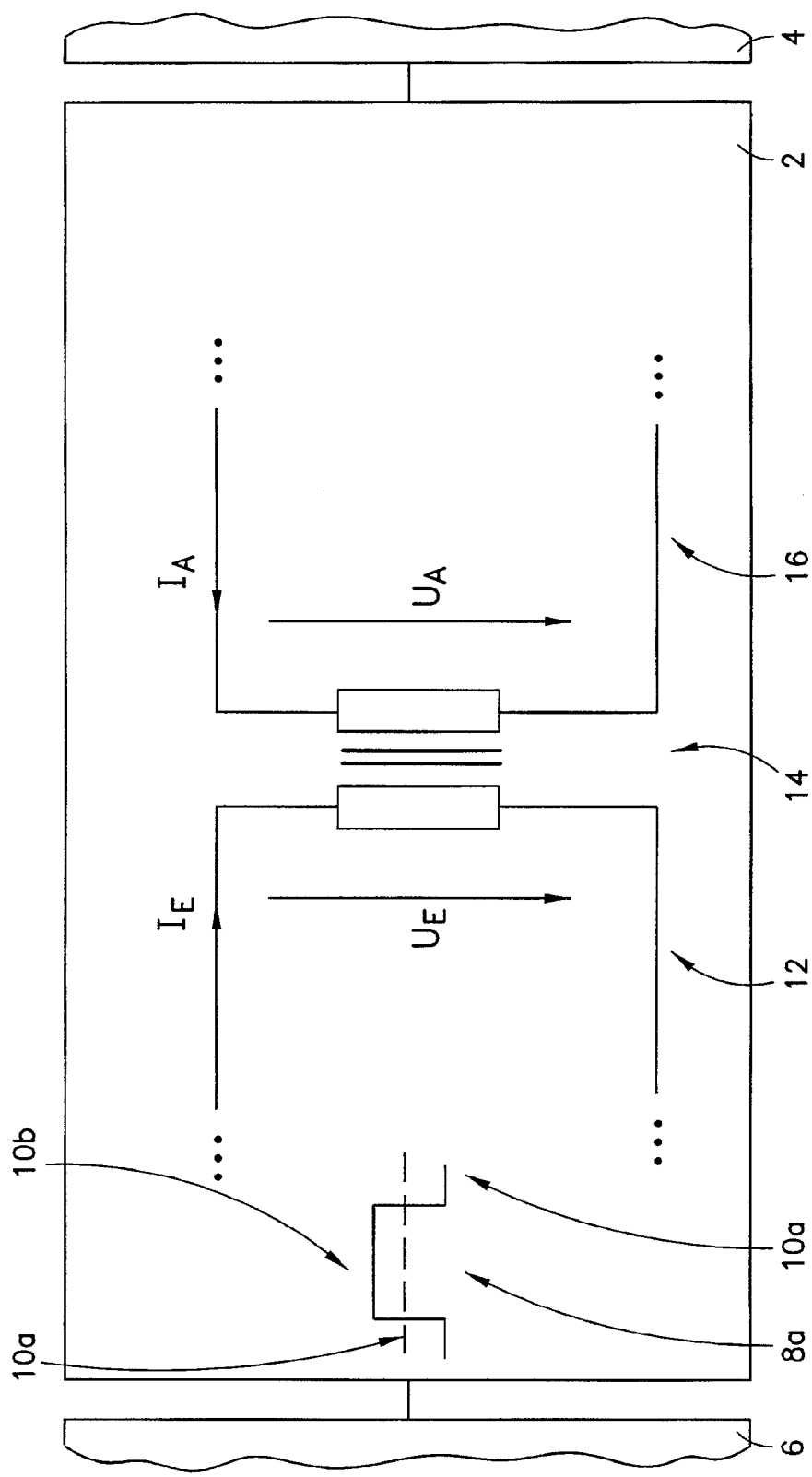
FIG. 1 shows a driver of a power semiconductor switch.

FIG. 1 shows a driver 2 for a power semiconductor 4, which is supplied by a logic circuit 6 with a signal 8 as a switching signal for the switching states "on" or "off" of power semiconductor 4. Signal 8 is therefore a binary signal or has only two values 10a corresponding to "off" and 10b corresponding to "on". Signal 8 is passed to an input 12 of a transformer 14, which effects the electrically isolating transmission of signal 8 to output 16. Transformer 14 has an input current $I_E$ and an input voltage $U_E$ as input variables at its input 12 and an output current $I_A$ and an output voltage $U_A$ as output variables at its output.

Figure 2:
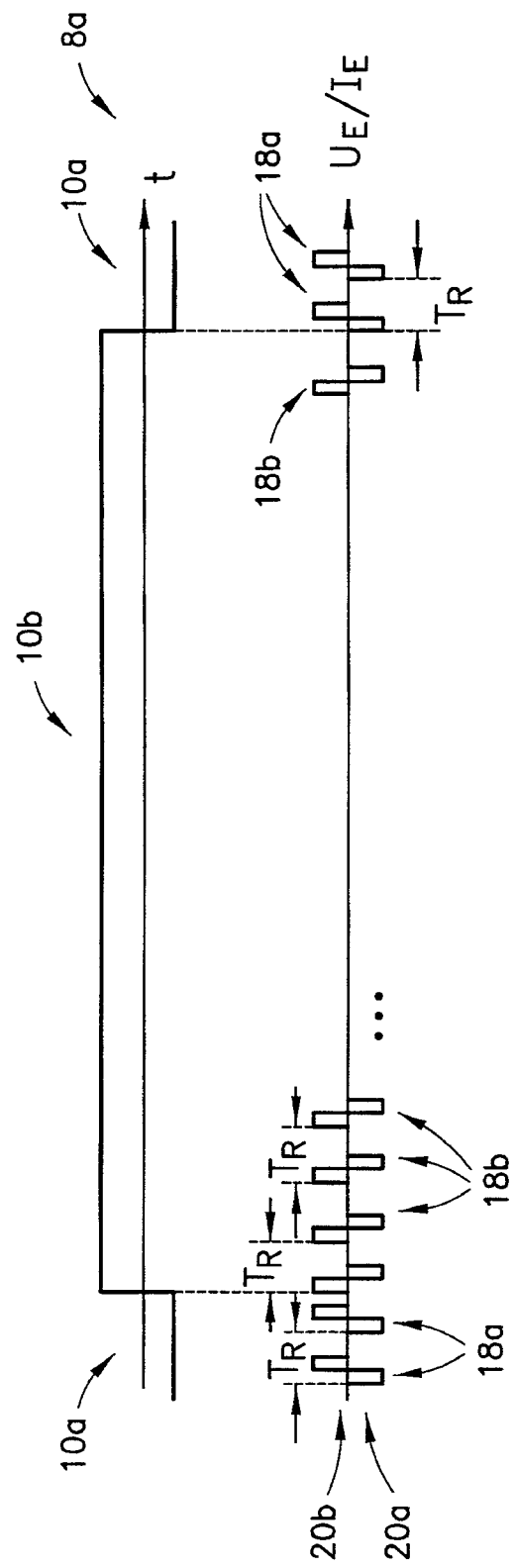
FIG. 2 shows signal profiles in the driver from FIG. 1 for the transmission of a first binary-value signal.

FIG. 2 shows signal 8 again, in an enlarged illustration, plotted against time t. According to the invention, then, in order to represent signal 8, pulse packets 18a, b are respectively fed to transformer 14 repetitively. Pulse packets 18a are chosen for the value 10a, and pulse packets 18b for the value 10b. The pulse packets 18a each consist of a sequence of a negative pulse 20a followed by a positive pulse 20b, whereas positive pulse packets 18b consist of a positive pulse 20b followed by a negative pulse 20a. The respective packets 18a or 18b are in each case transmitted repetitively, i.e. with a time interval $T_R$. Since the change in value 10a to value 10b, or 10b to value 10a in signal 8 can take place at any point in time, between the respective last pulse packet 18a and the first pulse packet 10b or the last pulse packet 18b and the first pulse packet 18a, there are in each case time intervals that are less than or equal to the interval $T_R$.

The respective pulse 20a or 20b corresponds in FIG. 1 to a respectively positive or negative value of the current $I_E$ or alternatively a positive or negative value of the voltage $U_E$.

Corresponding signal profiles for the output voltage $U_A$ or the output current $I_A$ are established at output 16 of transformer 14. Different polarity sequences for the output current $I_A$ or the output voltage $U_A$ also arise from the respective sequence of the polarity of pulse packets 18a or 18b.

Figure 3:
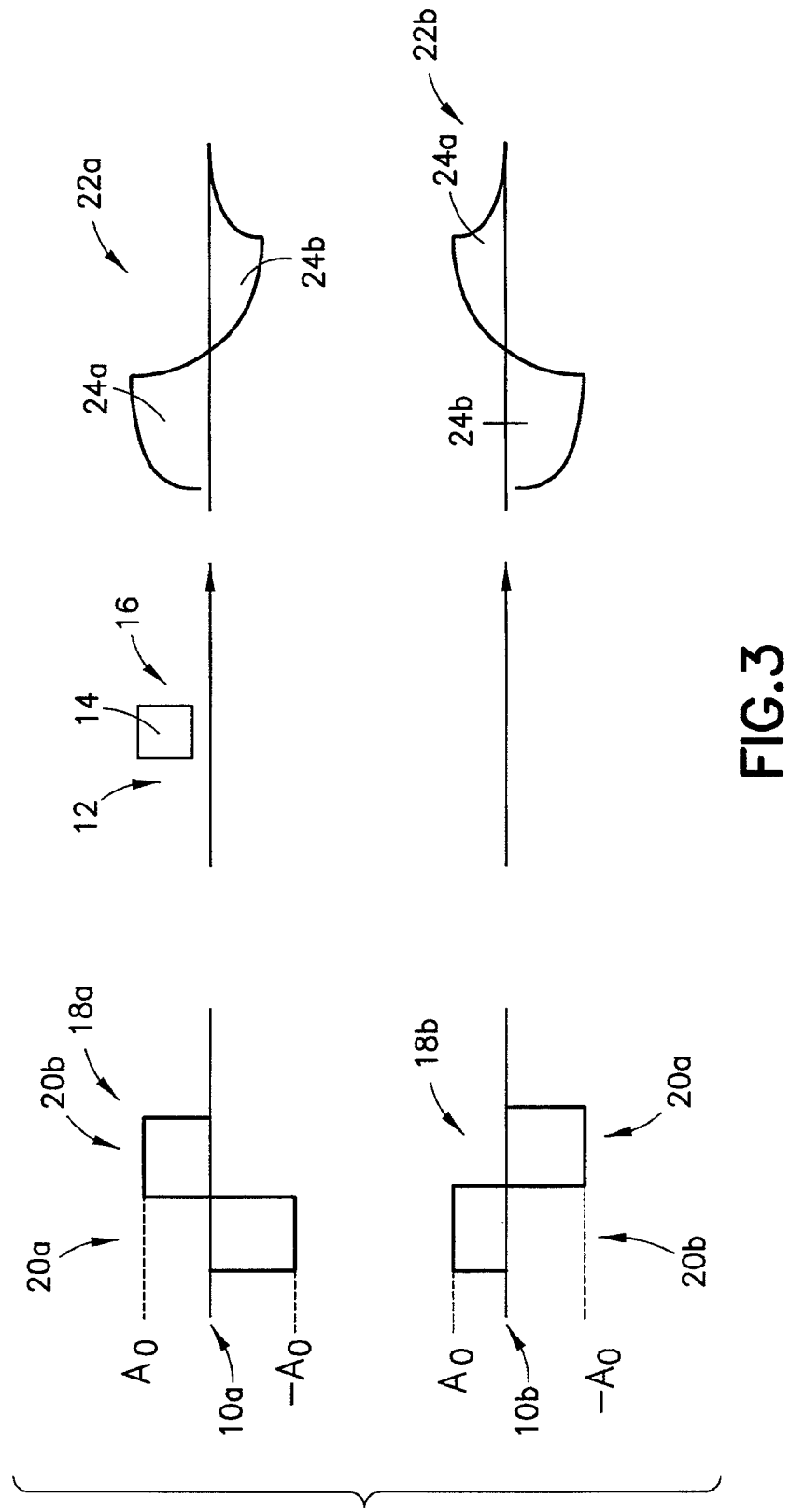
FIG. 3 shows signal profiles from FIG. 2 in detail.

FIG. 3 shows, for example, how a sequence 22a of a first positive and then negative pulse 24a, b thus arises for pulse packet 18a.

If, by contrast, a pulse packet 18b is applied to input 12, a sequence 22b of a negative pulse 24b and a positive pulse 24a arises. In accordance with the polarity sequence of the sequences 22a, b, the corresponding pulse sequence at input 12 and thus the corresponding value 10a, b of signal 8 are inferred on the side of output 16.

The detection takes place in each case on the basis of the totality of sequences 22a, b, that is to say also on the basis of the entire pulse packet 18a, b, and not just on the basis of that part (pulses 24a or 24b) of the sequences 22a, b which are to be assigned to an individual pulse 20a or 20b. Thus, the evaluation can take place, e.g., on the basis of the edge profile (positive or negative zero crossing) between the respective pulses 24a, b, that is to say in each case approximately centrally in the sequence 22a, b.

FIG. 3 additionally shows an embodiment wherein the amplitudes $A_0$ and $-A_0$ of the two pulses 20a, b of the pulse packets 18a, b are identical in terms of the absolute value ($A_0$), but have opposite polarity. The possibility of evaluating the entire two pulses 24a, b, also with regard to their amplitudes, in their entirety is also appropriate here. Both amplitudes should then again be approximately equal in magnitude and have opposite signs. In this way, too, the entire pulse sequence 18a, b is evaluated rather than only its partial pulses 20a, b with regard to the detection of the binary values to be transmitted (first or second value).

In the first embodiment mentioned above, the respective time intervals $T_R$ are always chosen to be equal in magnitude, that is to say that the repetitive repetition of respectively identical pulse packets 18a, b takes place with a fixed repetition frequency.

In an alternative embodiment of the method, through the use of time intervals $T_R$ which are different or vary in a signal-dependent manner, it is possible to transmit a second signal 8b in parallel with first signal 8a via transformer 14.

Figure 4:
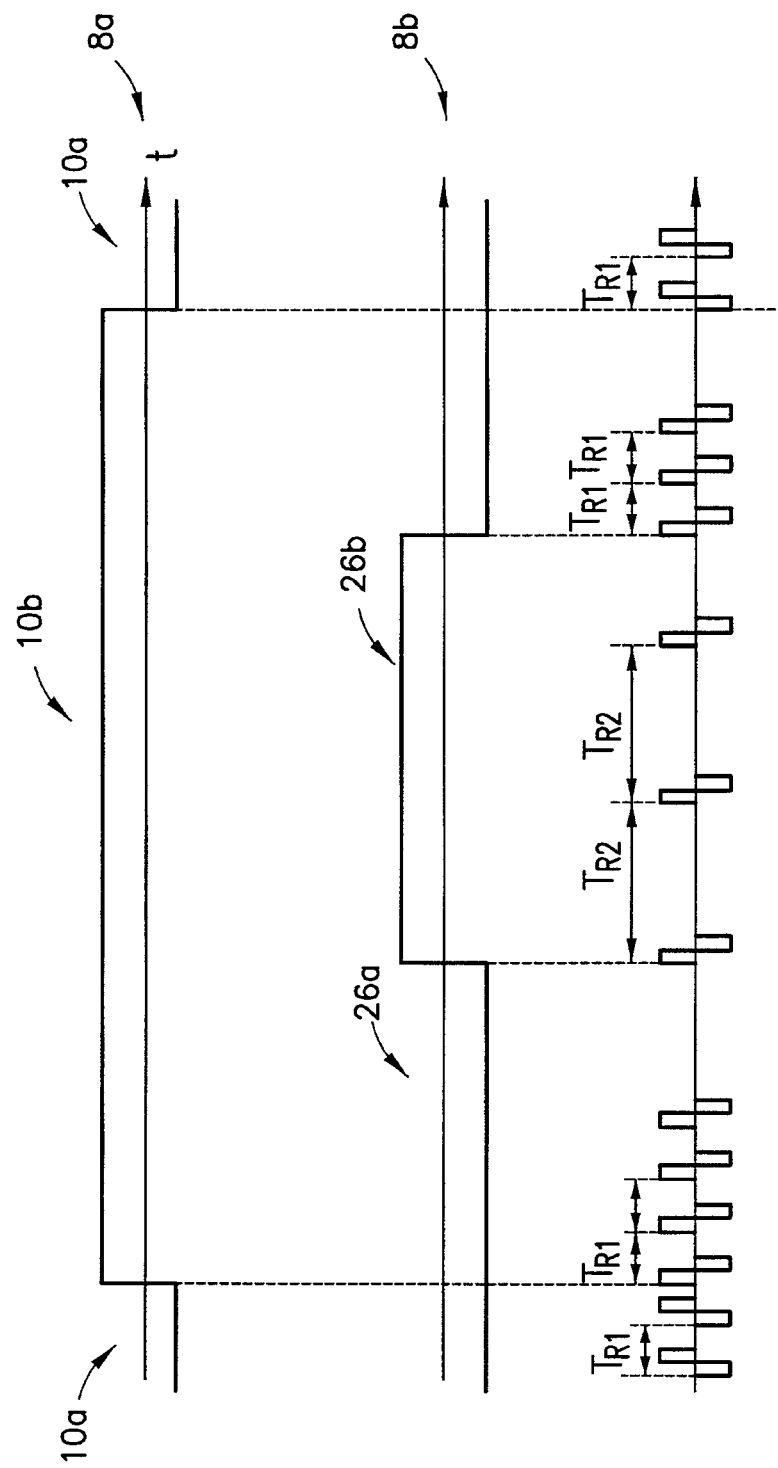
FIG. 4 shows alternative signal profiles in the driver for a second signal to be transmitted.

FIG. 4 accordingly shows a variant wherein signal 8b is also transmitted in addition to the signal 8a. The latter also has only two values 26a, b in the example. The values 26a, b are converted into different intervals $T_R$. In this case, the time intervals $T_{R1}$ correspond to value 26a, and time intervals $T_{R2}$ correspond to value 26b. The corresponding time intervals $T_{R1,2}$ are likewise evaluated or identified as time intervals between two sequences 22a, b again, in accordance with FIG. 3, at the output 16 and the values 26a, b are thereby reconstructed.

Figure 5:
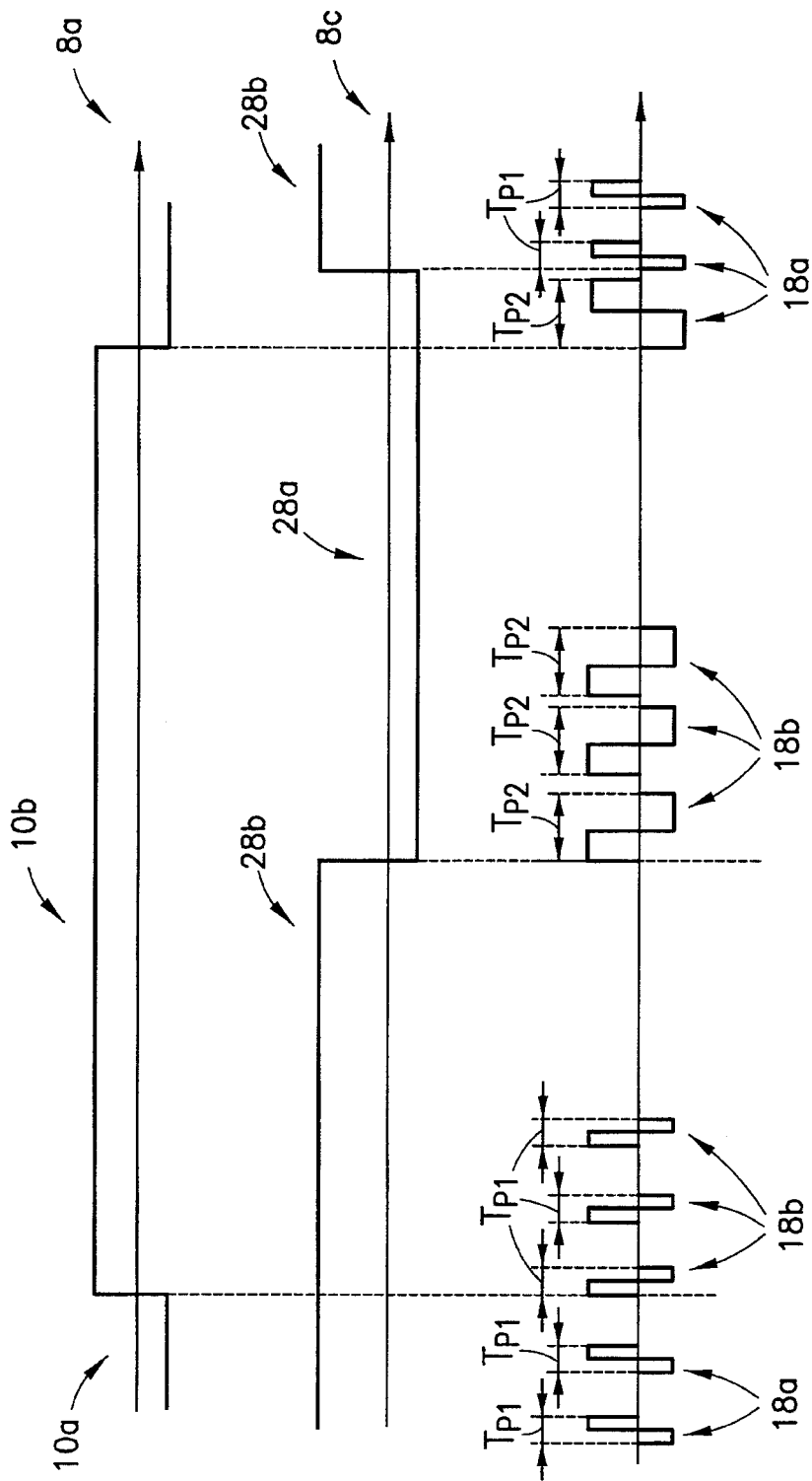
FIG. 5 shows alternative signal profiles in the driver for a third signal to be transmitted.

FIG. 5 shows a further alternative embodiment for representing a third signal 8c and the transmission thereof via transformer 14. Signal 8a is coded in a conventional manner, but the values 28a, b of signal 8c are coded by different pulse durations $T_{P1,2}$ of the individual pulses 18a, b. The evaluation at output 16 is again effected in accordance with the differentiation of the pulse durations of the pulses 24a, b or of the sequences 22a, b in a manner corresponding to FIG. 3.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A method for the repetitive transmission of a first signal representing a binary value via a transformer section of a driver of a power semiconductor comprising the steps of:
   applying, for a first value of the binary value, a first pulse packet as a sequence of a positive pulse and a negative pulse, or for a second value of the binary value, a second pulse packet as a sequence of a negative pulse and a positive pulse, to an input of the transformer;
   varying at the input the time interval ($T_R$) between two repetitively successive pulse packets of the same value in a manner dependent on a second signal to be transmitted;
   determining at the output the time interval ($T_R$) from the pulse packets mapped in the output variable ($U_A$, $I_A$);
   reconstructing the second signal from the time interval ($T_R$); and
   applying the respective pulse packets repetitively to the transformer section;
   wherein one of the first value and the second value is detected at the output of the transformer from the sequence of the polarity of an output variable within a transmitted pulse packet; and
   wherein the respective amplitudes of the two pulses within the pulse packet are at least approximately equal in magnitude.

2. A method for the repetitive transmission of a first signal representing a binary value via a transformer section of a driver of a power semiconductor comprising the steps of:
   applying, for a first value of the binary value, a first pulse packet as a sequence of a positive pulse and a negative pulse, or for a second value of the binary value, a second pulse packet as a sequence of a negative pulse and a positive pulse, to an input of the transformer;
   varying at the input the pulse duration ($T_{P1,2}$) of the pulse in a manner dependent on a third signal to be transmitted;
   applying the respective pulse packets repetitively to the transformer section;
   determining at the output the pulse duration ($T_{P1,2}$) of the pulse from the pulse packets mapped in the output variable ($U_A$, $I_A$); and
   reconstructing the third signal from the pulse duration ($T_{P1,2}$);
   wherein one of the first value and the second value is detected at the output of the transformer from the sequence of the polarity of an output variable within a transmitted pulse packet.

3. A method for the repetitive transmission of a first signal representing a binary value via a transformer section of a driver of a power semiconductor comprising the steps of:
   applying, for a first value of the binary value, a first pulse packet as a sequence of a positive pulse and a negative pulse, or for a second value of the binary value, a second pulse packet as a sequence of a negative pulse and a positive pulse, to an input of the transformer;
   varying at the input the pulse duration ($T_{P1,2}$) of the pulse in a manner dependent on a third signal to be transmitted;
   applying the respective pulse packets repetitively to the transformer section;
   determining at the output the pulse duration ($T_{P1,2}$) of the pulse from the pulse packets mapped in the output variable ($U_A$, $I_A$); and
   reconstructing the third signal from the pulse duration ($T_{P1,2}$);
   wherein one of the first value and the second value is detected at the output of the transformer from the sequence of the polarity of an output variable within a transmitted pulse packet; and
   wherein the respective amplitudes of the two pulses within the pulse packet are at least approximately equal in magnitude.

4. The method of claim 1, further comprising the steps of:
   varying at the input the pulse duration ($T_{P1,2}$) of the pulse in a manner dependent on a third signal to be transmitted;
   determining at the output the pulse duration ($T_{P1,2}$) of the pulse from the pulse packets mapped in the output variable ($U_A$, $I_A$); and
   reconstructing the third signal from the pulse duration ($T_{P1,2}$).

* * * * *